United States Patent
Chen et al.

(10) Patent No.: US 11,121,217 B2
(45) Date of Patent: *Sep. 14, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Lung Chen, Zhubei (TW); Kang-Min Kuo, Zhubei (TW); Long-Jie Hong, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/889,511

(22) Filed: Jun. 1, 2020

(65) Prior Publication Data

US 2020/0295136 A1    Sep. 17, 2020

Related U.S. Application Data

(63) Continuation of application No. 16/036,302, filed on Jul. 16, 2018, now Pat. No. 10,672,870.

(51) Int. Cl.
*H01L 29/08* (2006.01)
*H01L 29/66* (2006.01)
(Continued)

(52) U.S. Cl.
CPC .... *H01L 29/0847* (2013.01); *H01L 21/02532* (2013.01); *H01L 21/02636* (2013.01);
(Continued)

(58) Field of Classification Search
CPC ....... H01L 29/823418; H01L 29/66636; H01L 21/3065; H01L 21/02636; H01L 29/6656;
(Continued)

(56) References Cited

U.S. PATENT DOCUMENTS 9,024,368 B1   5/2015   Yu et al.
9,105,490 B2   8/2015   Wang et al.
(Continued)

OTHER PUBLICATIONS

Non-final Office Action issued in U.S. Appl. No. 16/036,302, dated Oct. 3, 2019.
(Continued)

*Primary Examiner* — Jose R Diaz
(74) *Attorney, Agent, or Firm* — McDermott Will & Emery LLP

(57) ABSTRACT

In a method of manufacturing a semiconductor device, a fin structure is formed over a substrate. The fin structure has a channel region and a source/drain region. A gate structure is formed over the channel region of the fin structure. A first source/drain etching is performed to recess the source/drain region of the fin structure. After the first source/drain etching, a second source/drain etching is performed to further recess the source/drain region of the fin structure. After the second source/drain etching, a third source/drain etching is performed to further recess the source/drain region of the fin structure, thereby forming a source/drain recess. One or more epitaxial layers are formed in the source/drain recess. The first source/drain etching is isotropic etching and the second source/drain etching is anisotropic etching.

20 Claims, 14 Drawing Sheets

(51) Int. Cl.

| | | |
|---|---|---|
| *H01L 21/3065* | (2006.01) | |
| *H01L 21/02* | (2006.01) | |
| *H01L 29/167* | (2006.01) | |
| *H01L 29/165* | (2006.01) | |
| *H01L 29/78* | (2006.01) | |
| *H01L 21/8238* | (2006.01) | |
| *H01L 29/36* | (2006.01) | |
| *H01L 21/033* | (2006.01) | |

(52) U.S. Cl.
CPC ........ *H01L 21/3065* (2013.01); *H01L 29/165* (2013.01); *H01L 29/167* (2013.01); *H01L 29/6656* (2013.01); *H01L 29/66636* (2013.01); *H01L 29/66795* (2013.01); *H01L 29/7848* (2013.01); *H01L 29/7851* (2013.01); *H01L 21/0217* (2013.01); *H01L 21/02164* (2013.01); *H01L 21/0332* (2013.01); *H01L 21/0337* (2013.01); *H01L 21/823814* (2013.01); *H01L 21/823821* (2013.01); *H01L 29/36* (2013.01); *H01L 29/66545* (2013.01)

(58) Field of Classification Search
CPC ............. H01L 29/167; H01L 21/02532; H01L 29/165; H01L 29/7851; H01L 29/7848; H01L 29/66795; H01L 21/823814; H01L 29/36; H01L 21/0332; H01L 21/0337; H01L 29/66545; H01L 21/02164; H01L 21/0217; H01L 21/823821
See application file for complete search history.

(56) References Cited

U.S. PATENT DOCUMENTS

| | | | |
|---|---|---|---|
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,443,852 | B2 | 9/2016 | Jeong et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 10,672,870 | B2 * | 6/2020 | Chen .................. H01L 21/0245 |

OTHER PUBLICATIONS

Notice of Allowance issued in U.S. Appl. No. 16/036,302, dated Jan. 30, 2020.

\* cited by examiner

SEMICONDUCTOR DEVICE AND MANUFACTURING METHOD THEREOF

RELATED APPLICATION

This application is Continuation of U.S. patent application Ser. No. 16/036,302, filed on Jul. 16, 2018, now U.S. Pat. No. 10,672,870, the entire contents of which are incorporated herein by reference.

TECHNICAL FIELD

The disclosure relates to a semiconductor integrated circuit, and more particularly to a semiconductor device having an epitaxial source/drain (S/D) structure with voids and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
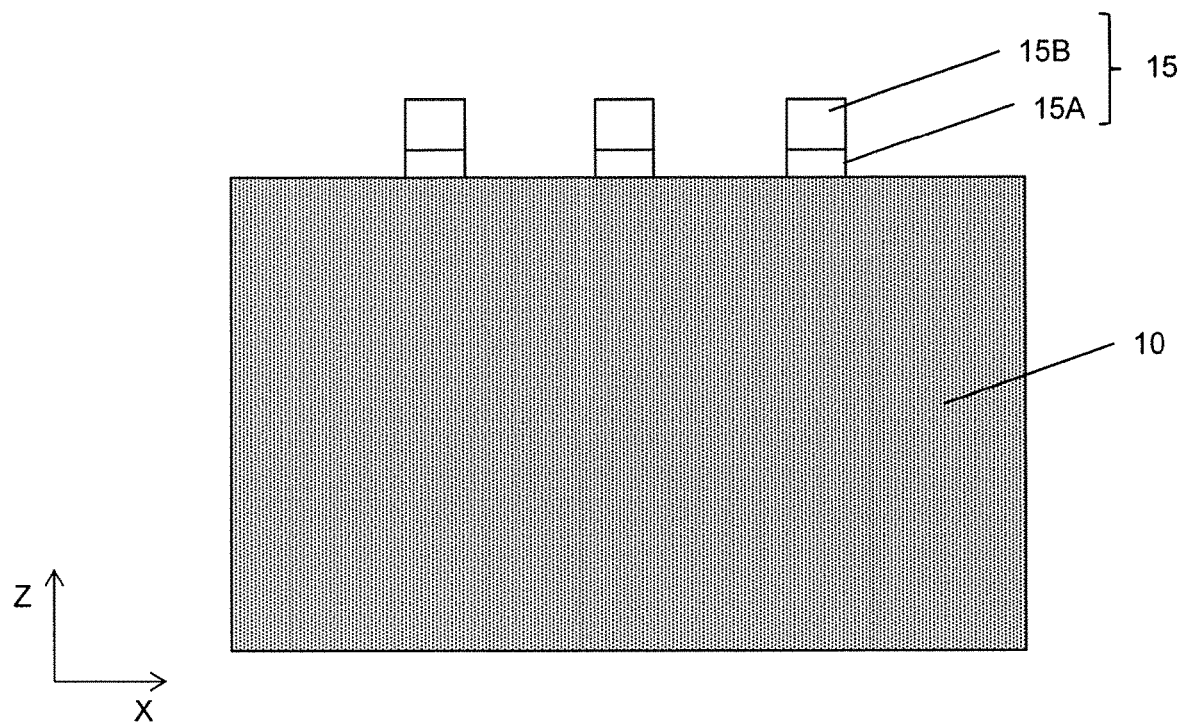
FIG. 1 shows a cross sectional view of one of the various stages for manufacturing a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

Examples of devices that can benefit from one or more embodiments of the present disclosure are semiconductor devices. The semiconductor devices include a fin field effect transistor (FinFET) and other MOS transistors. Other types of transistors, such as a gate-all-around (GAA) FET, also benefit from the present embodiments. Semiconductor devices may further include a static random access memory (SRAM) and/or other logic circuits, passive components such as resistors, capacitors, and inductors, and active components. The semiconductor devices may include a plurality of semiconductor devices (e.g., transistors), which may be interconnected. It is understood, however, that the application should not be limited to a particular type of device, except as specifically claimed.

FIGS. 1-9 show various stages for manufacturing a semiconductor device according to an embodiment of the present disclosure. It is understood that additional operations can be provided before, during, and after processes shown by FIGS. 1-9, and some of the operations described below can be replaced or eliminated, for additional embodiments of the method. The order of the operations/processes may be interchangeable.

A mask layer 15 is formed over a substrate 10. The mask layer 15 is formed by, for example, a thermal oxidation process and/or a chemical vapor deposition (CVD) process. The substrate 10 is, for example, a p-type silicon or germanium substrate with an impurity concentration in a range from about $1 \times 10^{15}$ atoms·cm$^{-3}$ to about $1 \times 10^{16}$ atoms·cm$^{-3}$. In other embodiments, the substrate is an n-type silicon or germanium substrate with an impurity concentration in a range from about $1 \times 10^{15}$ atoms·cm$^{-3}$ to about $1 \times 10^{16}$ atoms·cm$^{-3}$.

Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The mask layer 15 includes, for example, a pad oxide (e.g., silicon oxide) layer 15A and a silicon nitride mask layer 15B in some embodiments.

The pad oxide layer 15A may be formed by using thermal oxidation or a CVD process. The silicon nitride mask layer 15B may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 15A is in a range from about 2 nm to about 15 nm and the thickness of the silicon nitride mask layer 15B is in a range from about 2 nm to about 50 nm in some embodiments. A mask pattern is further formed over the mask layer. The mask pattern is, for example, a resist pattern formed by lithography operations.

By using the mask pattern as an etching mask, a hard mask pattern 15 of the pad oxide layer and the silicon nitride mask layer is formed, as shown in FIG. 1.

Figure 2:
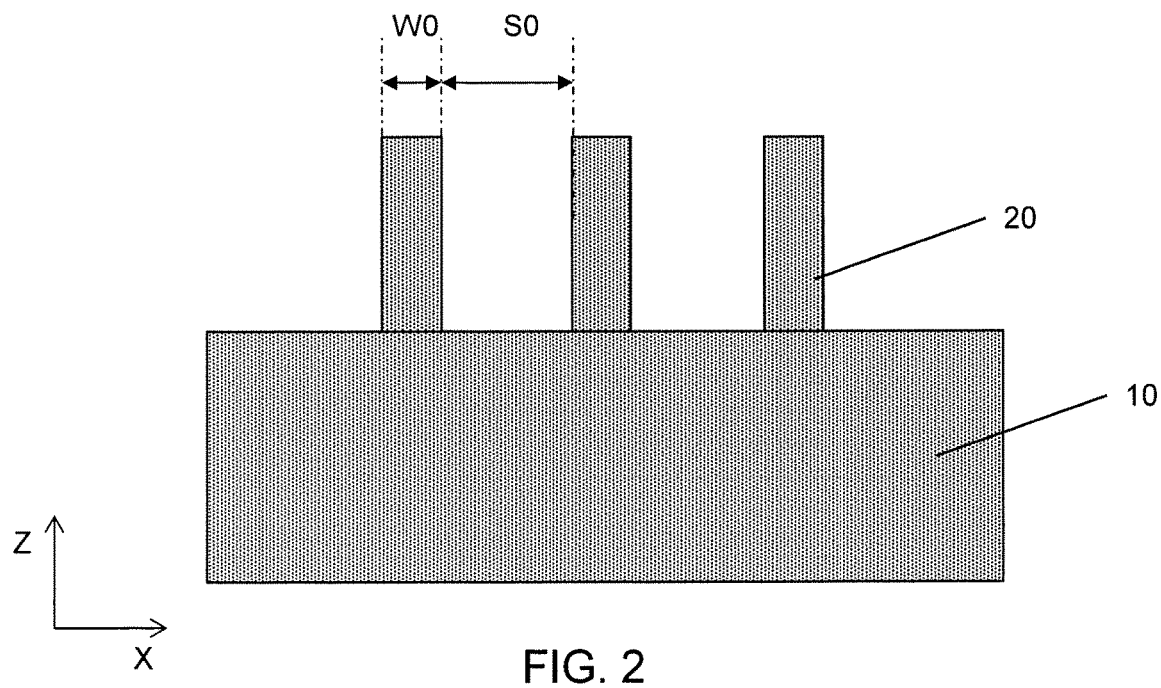
FIG. 2 shows a cross sectional view of one of the various stages for manufacturing a semiconductor device according to an embodiment of the present disclosure.

Then, as shown in FIG. 2, by using the hard mask pattern 15 as an etching mask, the substrate 10 is patterned into fin structures 20 by trench etching using a dry etching method and/or a wet etching method.

In FIG. 2, three fin structures 20 are disposed over the substrate 10. However, the number of the fin structures is not limited to three. The numbers may be as small as one, or more than three. In addition, one or more dummy fin structures may be formed adjacent to both sides of the fin structure 20 to improve pattern fidelity in patterning processes.

The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

The width W0 of the fin structure 20 is in a range from about 5 nm to about 40 nm in some embodiments, and is in a range from about 7 nm to about 12 nm in other embodiments. The space S0 between two fin structures is in a range from about 5 nm to about 40 nm in some embodiments, and is in a range from about 8 nm to about 15 nm in other embodiments. The height (along the Z direction) of the fin structure 20 is in a range from about 100 nm to about 300 nm in some embodiments, and is in a range from about 50 nm to 100 nm in other embodiments.

The lower part of the fin structure 20 under the gate structure 40 (see, FIG. 5A) may be referred to as a well region, and the upper part of the fin structure 20 may be referred to as a channel region. Under the gate structure 40, the well region is embedded in the isolation insulating layer 30 (see, FIG. 5A), and the channel region protrudes from the isolation insulating layer 30. A lower part of the channel region may also be embedded in the isolation insulating layer 30 to a depth of about 1 nm to about 5 nm.

The height of the well region is in a range from about 60 nm to 100 nm in some embodiments, and the height of the channel region is in a range from about 40 nm to 60 nm, and is in a range from about 38 nm to about 55 nm in other embodiments.

Figure 3:
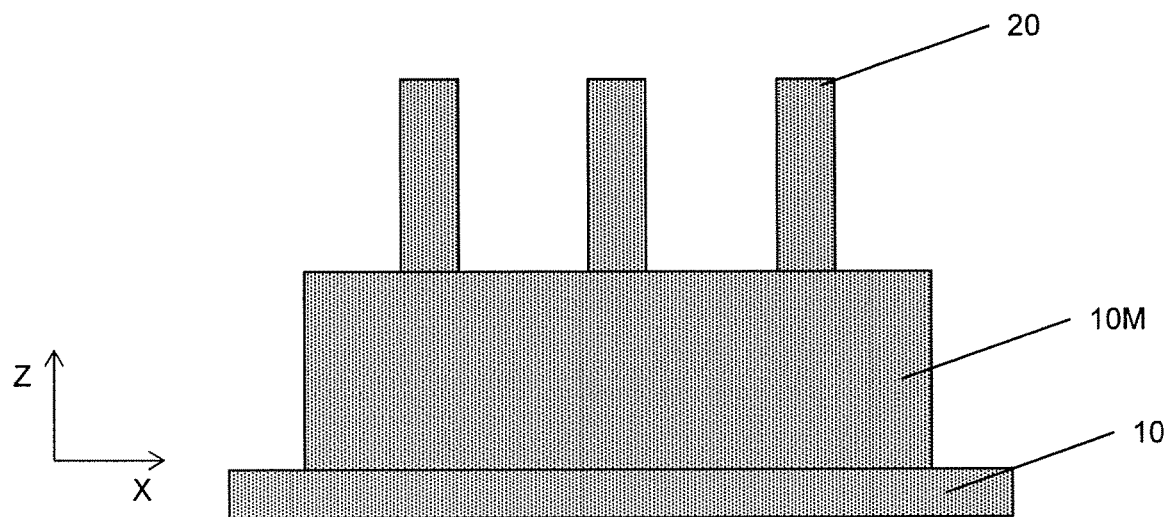
FIG. 3 shows a cross sectional view of one of the various stages for manufacturing a semiconductor device according to an embodiment of the present disclosure.

After the fin structures 20 are formed, the substrate 10 is further etched to form a mesa shape 10M, as shown in FIG. 3. In other embodiments, the mesa shape 10M is first formed, and then the fin structures 20 are formed.

After the fin structures 20 and the mesa shape 10M are formed, the isolation insulating layer 30 is formed in spaces between the fin structures and/or a space between one fin structure and another element formed over the substrate 10. The isolation insulating layer 30 may also be called a "shallow-trench-isolation (STI)" layer. The insulating material for the isolation insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous.

Figure 4:
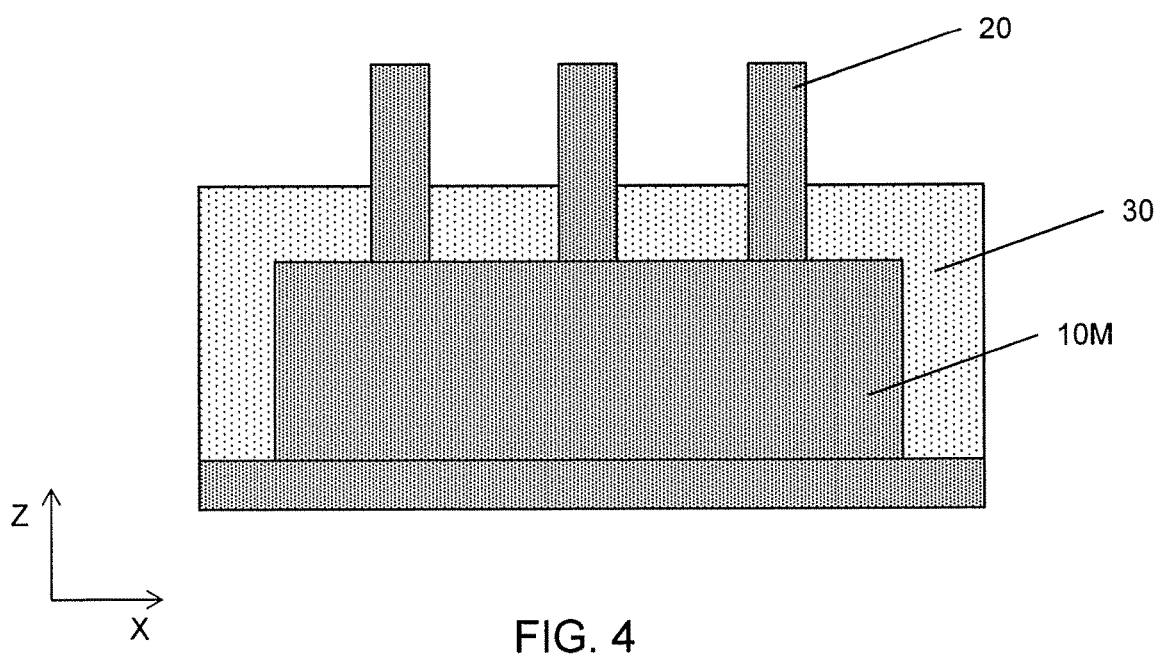
FIG. 4 shows a cross sectional view of one of the various stages for manufacturing a semiconductor device according to an embodiment of the present disclosure.

The insulating layer 30 is first formed in a thick layer so that the fin structures are embedded in the thick layer, and the thick layer is recessed so as to expose the upper portions of the fin structures 20, as shown in FIG. 4. The height H1 of the fin structures from the upper surface of the isolation insulating layer 30 is in a range from about 20 nm to about 100 nm in some embodiments, and is in a range from about 30 nm to about 50 nm in other embodiments. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

Figure 5A:
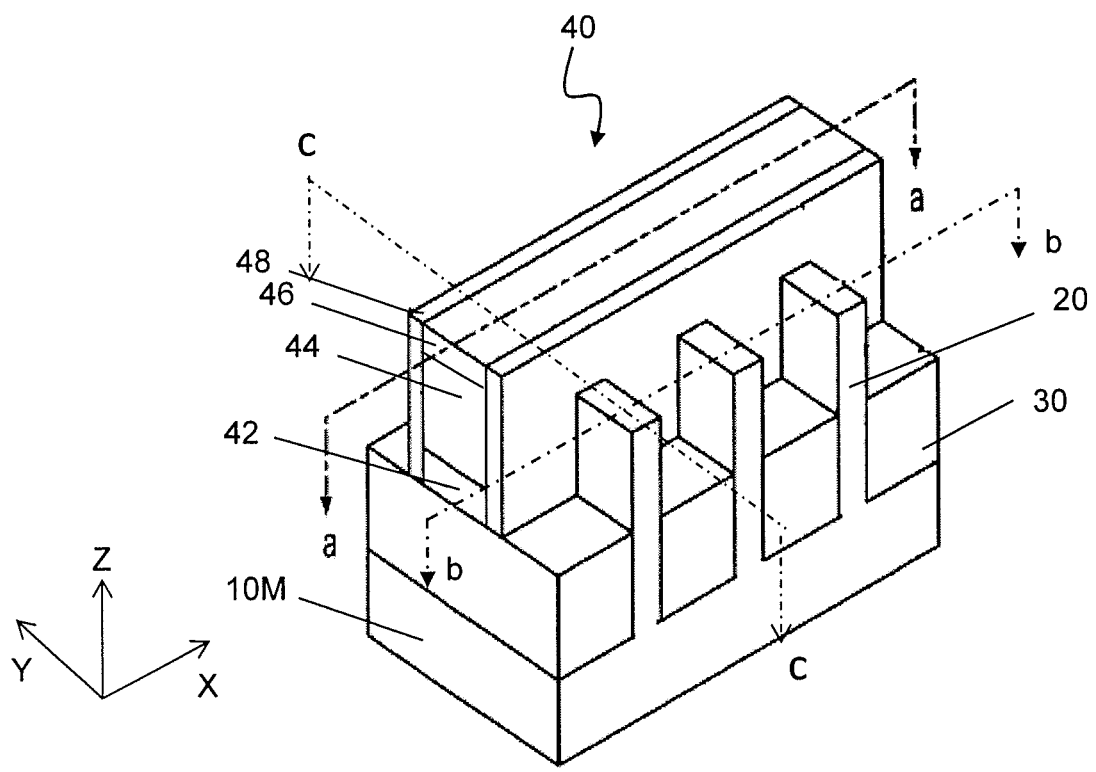
FIGS. 5A, 5B, 5C and 5D show various views of one of the various stages for manufacturing a semiconductor device according to an embodiment of the present disclosure.
Figure 5B:
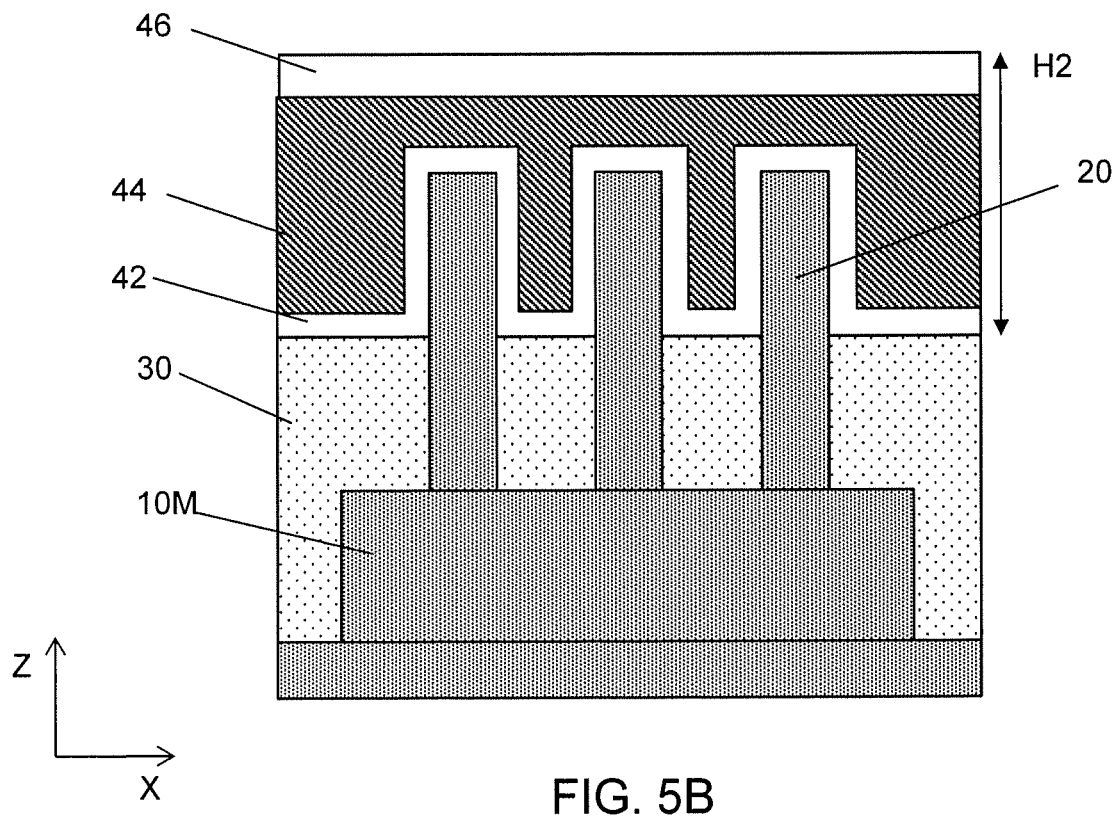
Figure 5C:
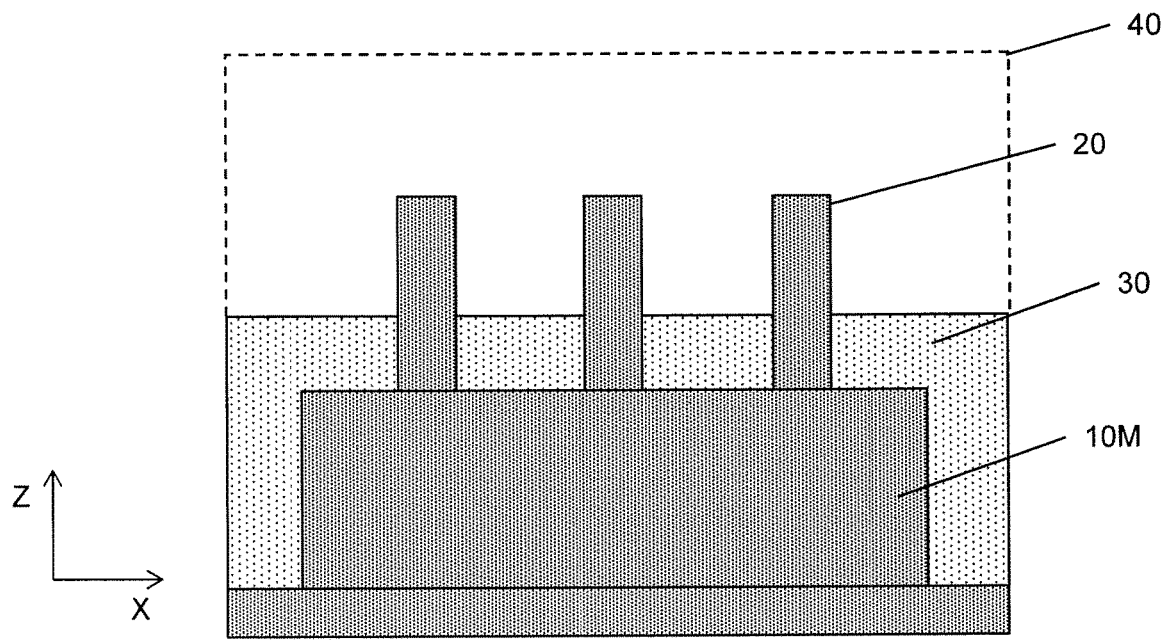
Figure 5D:
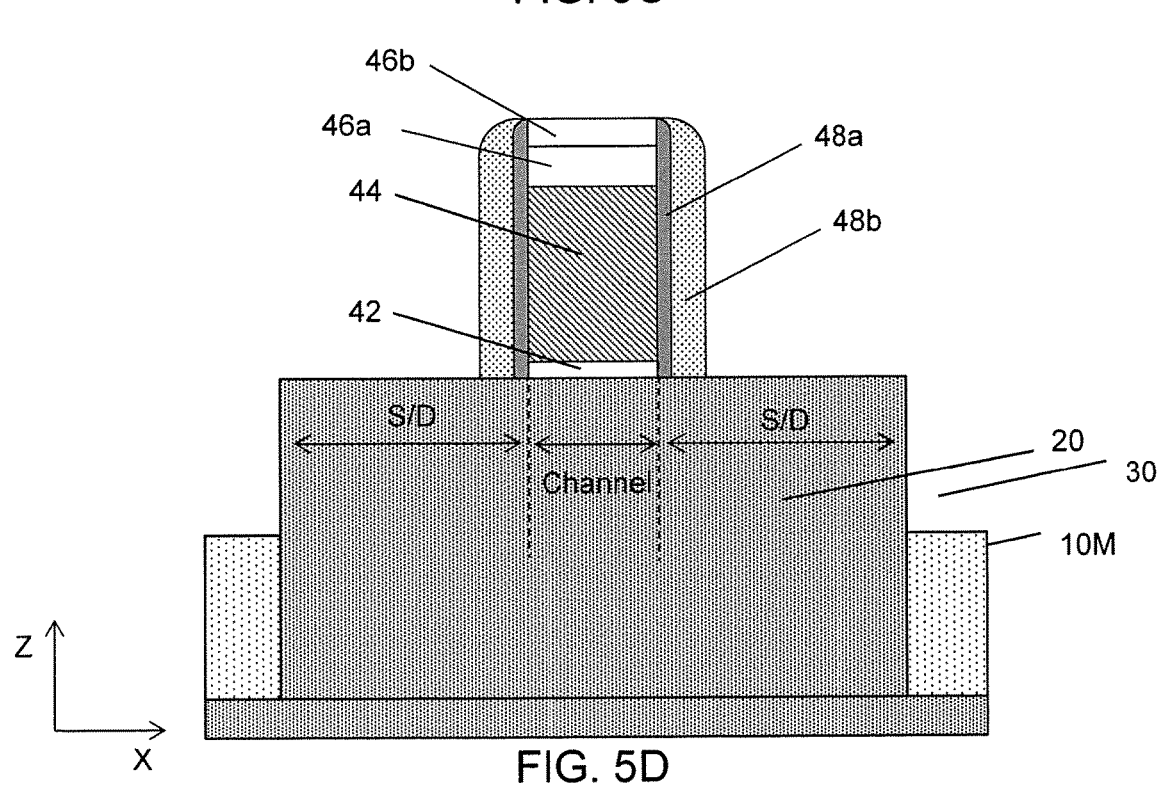

After the insulating layer 30 is formed, a gate structure 40 is formed over the fin structures 20, as shown in FIGS. 5A-5D. FIG. 5A is a perspective view, FIG. 5B is a cross sectional view along line a-a of FIG. 5A, FIG. 5C is a cross sectional view along line b-b of FIG. 5A, and FIG. 5D is a cross sectional view along line c-c of FIG. 5A. FIGS. 6-9 are also cross sectional views corresponding to line c-c of FIG. 5A.

As shown in FIG. 5A, the gate structure 40 extends in the X direction, while the fin structures 20 extend in the Y direction.

To fabricate the gate structure 40, a dielectric layer and a poly silicon layer are formed over the isolation insulating layer 30 and the exposed fin structures 20, and then patterning operations are performed so as to obtain gate structures including a gate pattern 44 made of poly silicon and a dielectric layer 42. In some embodiments, the polysilicon layer is patterned by using a hard mask, and the hard mask remains on the gate pattern 44 as a hard mask layer 46. The hard mask layer 46 includes one or more layers of insulating material. The hard mask layer 46 includes a silicon nitride layer 46a and a silicon oxide layer 46b in some embodiments, as shown in FIG. 5D. In other embodiments, the hard mask layer 46 includes a silicon nitride layer formed over a silicon oxide layer. The insulating material for the hard mask layer 46 may be formed by CVD, PVD, ALD, e-beam evaporation, or other suitable process. In some embodiments, the dielectric layer 42 may include one or more layers of silicon oxide, silicon nitride, silicon oxy-nitride, or high-k dielectrics. In some embodiments, a thickness of the dielectric layer 42 is in a range from about 2 nm to about 20 nm, and in a range from about 2 nm to about 10 nm in other embodiments. In some embodiments, a height H2 of the gate structures is in a range from about 50 nm to about 400 nm in some embodiments, and is in a range from about 100 nm to 200 nm in other embodiments.

In some embodiments, a gate replacement technology is employed. In such a case, the gate pattern 44 and the dielectric layer 42 are a dummy gate electrode and a dummy gate dielectric layer, respectively, which are subsequently removed. If a gate-first technology is employed, the gate pattern 44 and the dielectric layer 42 are used as a gate electrode and a gate dielectric layer.

Further, gate sidewall spacers 48 are formed on both sidewalls of the gate pattern. The sidewall spacers 48 include one or more layers of insulating material, such as $SiO_2$, SiN, SiON, SiOCN or SiCN, which are formed by CVD, PVD, ALD, e-beam evaporation, or other suitable process. A low-k dielectric material may be used as the sidewall spacers. In some embodiments, the side walls spacers 48 include first sidewall spacers 48a disposed on opposing side faces of the gate electrode 44 (and the gate dielectric layer 42 and the hard mask layer 46), and second sidewall spacers 48b disposed on the first sidewall spacers 48b, as shown in FIG. 5D. Each of the first sidewall spacers 48a and the second sidewall spacers 48b include one or more layers of dielectric material.

The sidewall spacers 48 are formed by forming a blanket layer of insulating material and performing anisotropic etching. In one embodiment, the sidewall spacer layers are made of silicon nitride based material, such as silicon nitride, SiON, SiOCN or SiCN. In some embodiments, the first sidewall spacers 48a and the second sidewall spacers 48b are made of different material from each other. In certain embodiments, the first sidewall spacers 48a include SiCN, and the second sidewall spacers 48b include silicon nitride.

In some embodiments, the thickness of the first sidewall spacers 48a is smaller than the thickness of the second sidewall spacers 48b. In certain embodiments, the thickness of the first sidewall spacers 48a is in a range from about 0.5 nm to about 5 nm and the thickness of the second sidewall spacers 48b is in a range from about 1 nm to about 10 nm.

Figure 6:
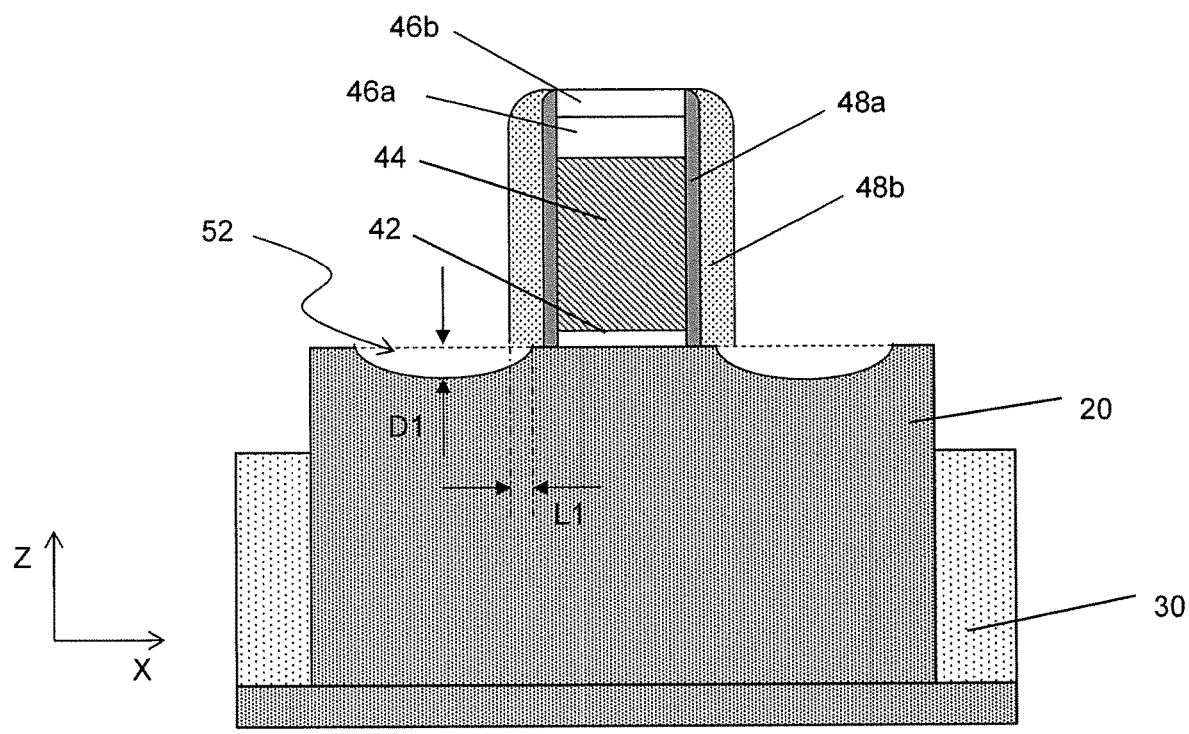
FIG. 6 shows a cross sectional view of one of the various stages for manufacturing a semiconductor device according to an embodiment of the present disclosure.

Then, as shown in FIG. 6, a first source/drain etching is performed to etch down the source/drain region of the fin structure 20 not covered by the gate structure, to form a first recess 52. In some embodiments, the first source/drain etching is isotropic etching, such as isotropic plasma dry etching. By the first source/drain etching, the source/drain region of the fin structure is laterally etched to a portion under the sidewall spacer 48a, 48b. In some embodiments, the first recess 52 penetrates under the second sidewall spacer 48b but does not reach a portion under the first sidewall spacer 48a. In certain embodiments, the location of the end of the first recess 52 under the second sidewall spacer 48b is at about 10% to about 90% of the thickness of the second sidewall spacer 48b. In other embodiments, the first recess 52 penetrates under the first sidewall spacers 48a but does not reach the channel region (under the gate electrode). In certain embodiments, the location of the end of the first recess 52 under the first sidewall spacer 48a is at about 10% to about 90% of the thickness of the first sidewall spacer 48a. The penetration amount L1 of the first recess 52 measured from the outer surface of the second sidewall spacer 48b is in a range from about 0.5 nm to about 5 nm in some embodiments. The depth D1 of the first recess 52 is in range from about 1 nm to about 10 nm in some embodiments. In some embodiments, D1≥L1.

Figure 7:
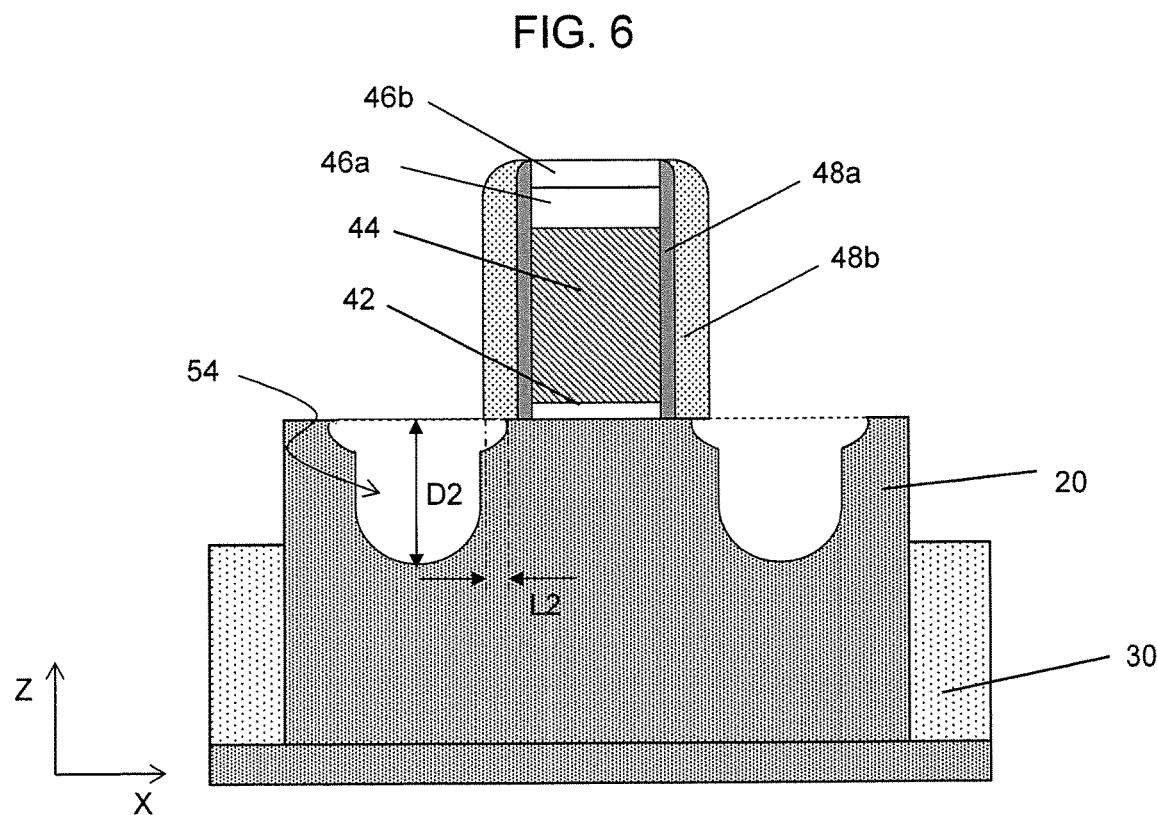
FIG. 7 shows a cross sectional view of one of the various stages for manufacturing a semiconductor device according to an embodiment of the present disclosure.

Further, as shown in FIG. 7, a second source/drain etching is performed to further etch down the source/drain region of the fin structure 20, to form a second recess 54. In some embodiments, the second source/drain etching is anisotropic etching, such as anisotropic plasma dry etching. In the anisotropic etching, the source/drain region is mainly vertically etched and is not substantially laterally etched. In some embodiments, in the second source/drain etching, an amount of vertical etching is 10 times or more an amount of lateral etching. In certain embodiments, the ratio between the vertical etching amount to the lateral etching amount is in a range from about 10:1 to about 1000:1.

After the second source/drain etching, the second recess 54 has an upper portion corresponding to the first recess and a bottom U-shape portion as shown in FIG. 7. In some embodiments, the second recess 54 penetrates under the second sidewall spacer 48b but does not reach a portion under the first sidewall spacer 48a. In certain embodiments, the location of the end of the second recess 54 under the second sidewall spacer 48b is at about 10% to about 90% of the thickness of the second sidewall spacer 48b. In other embodiments, the second recess 54 penetrates under the first sidewall spacers 48a but does not reach the channel region (under the gate electrode). In certain embodiments, the location of the end of the second recess 54 under the first sidewall spacer 48a is at about 10% to about 90% of the thickness of the first sidewall spacer 48a. The penetration amount L2 of the second recess 54 measured from the outer surface of the second sidewall spacer 48b is in a range from about 0.8 nm to about 7 nm in some embodiments. The depth D2 of the second recess 54 is in range from about 5 nm to about 30 nm in some embodiments. In some embodiments, the bottom of the second recess is located below the upper surface of the isolation insulating layer 30.

Figure 8:
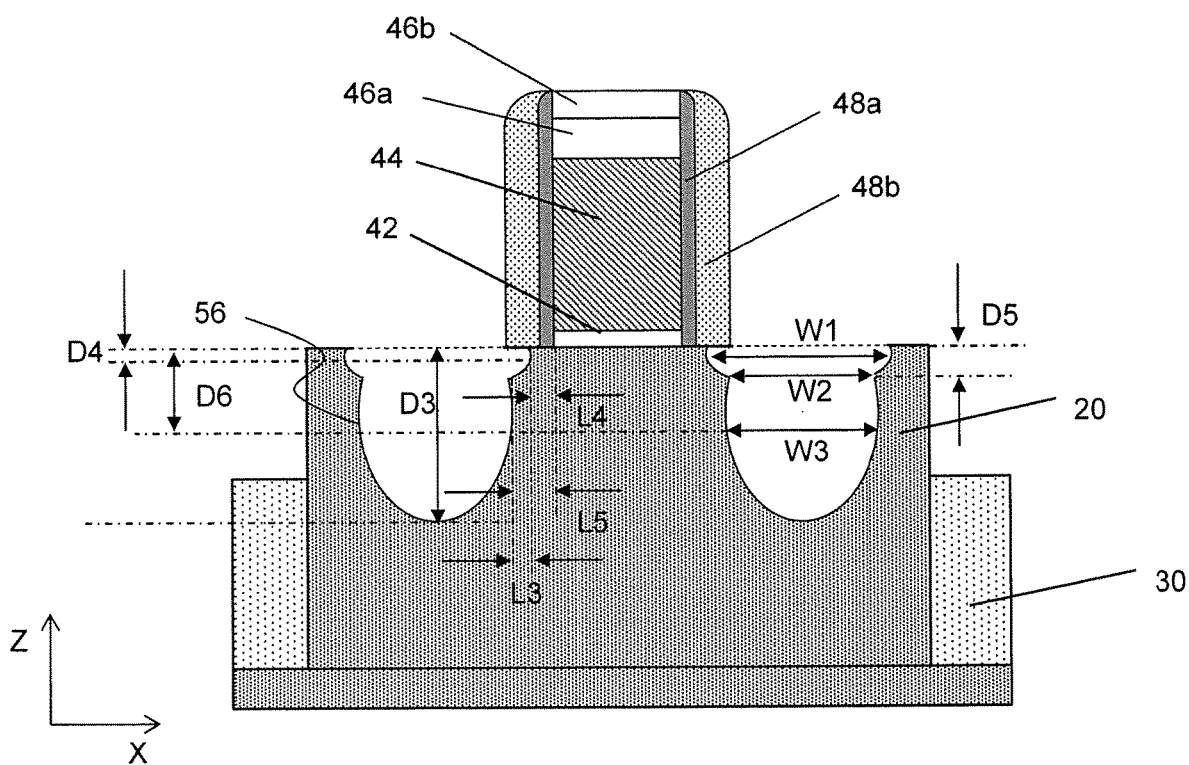
FIG. 8 shows a cross sectional view of one of the various stages for manufacturing a semiconductor device according to an embodiment of the present disclosure.

Further, as shown in FIG. 8, a third source/drain etching is performed to further etch down the source/drain region of the fin structure 20, to form a third recess 56. In some embodiments, the third source/drain etching is isotropic etching, such as isotropic plasma dry etching.

After the third source/drain etching, the third recess 56 has an upper portion corresponding to the first recess and a bottom portion as shown in FIG. 8. In some embodiments, the third recess 56 penetrates under the second sidewall spacer 48b but does not reach a portion under the first sidewall spacer 48a. In certain embodiments, the location of the end of the third recess 56 under the second sidewall spacer 48b is at about 10% to about 90% of the thickness of the second sidewall spacer 48b. In other embodiments, the third recess 56 penetrates under the first sidewall spacers 48a but does not reach the channel region (under the gate electrode). In certain embodiments, the location of the end of the third recess 56 under the first sidewall spacer 48a is at about 10% to about 90% of the thickness of the first sidewall spacer 48a. The penetration amount L3 of the third recess 56 measured from the outer surface of the second sidewall spacer 48b is in a range from about 2 nm to about 15 nm in some embodiments. The depth D3 of the third recess 56 is in range from about 10 nm to about 50 nm in some embodiments. In some embodiments, the bottom of the third recess 56 is located below the upper surface of the isolation insulating layer 30.

As shown in FIG. 8, the third recess 56 has a first width W1, a second width W2 smaller than the first width and a third width W3 greater than the second width. In some embodiments, the upper portion of the third recess 56 has the largest width W1, as shown in FIG. 8. In some embodiments, the largest width W1 is the largest width of the third recess 56. The location of the largest width W1 is at a depth D4 from the top of the channel region. In some embodiments, 0<D4<0.2×D3. In other embodiments, 0.05×D3<D4<0.1×D3. The second width W2 is a width of the third recess at the interface between the upper portion and the bottom portion of the third recess 56. As shown in FIG. 8, the width of the third recess decreases from the largest width W1 as the depth increases, has the second width W2 at the interface and then increases to have the third width W3. The third width W3 is the largest width of the bottom portion. The location of the interface (the second width) is at a depth D5 from the top of the channel region. In some embodiments, 0.1×D3<D5<0.3×D3. In other embodiments, 0.15×D3<D5<0.2×D3. The location of the third width W3 is at a depth D6 from the top of the channel region. In some embodiments, 0.3×D3<D6<0.7×D3. In other embodiments, 0.4×D3<D6<0.6×D3.

After the third recess 54 is formed, the proximity L4 (minimum distance) between the end of the upper portion (at the width W1) and the channel region is in a range from about 0.01 nm to about 2 nm in some embodiments, and is in a range from about 0.05 nm to about 1.5 nm in other embodiments.

The proximity L5 (minimum distance) between the end of the bottom portion (at the width W3) and the channel region is in a range from about 0.03 nm to about 3 nm in some embodiments, and is in a range from about 0.1 nm to about 2 nm in other embodiments. In some embodiments, L4≤L5.

Figure 9:
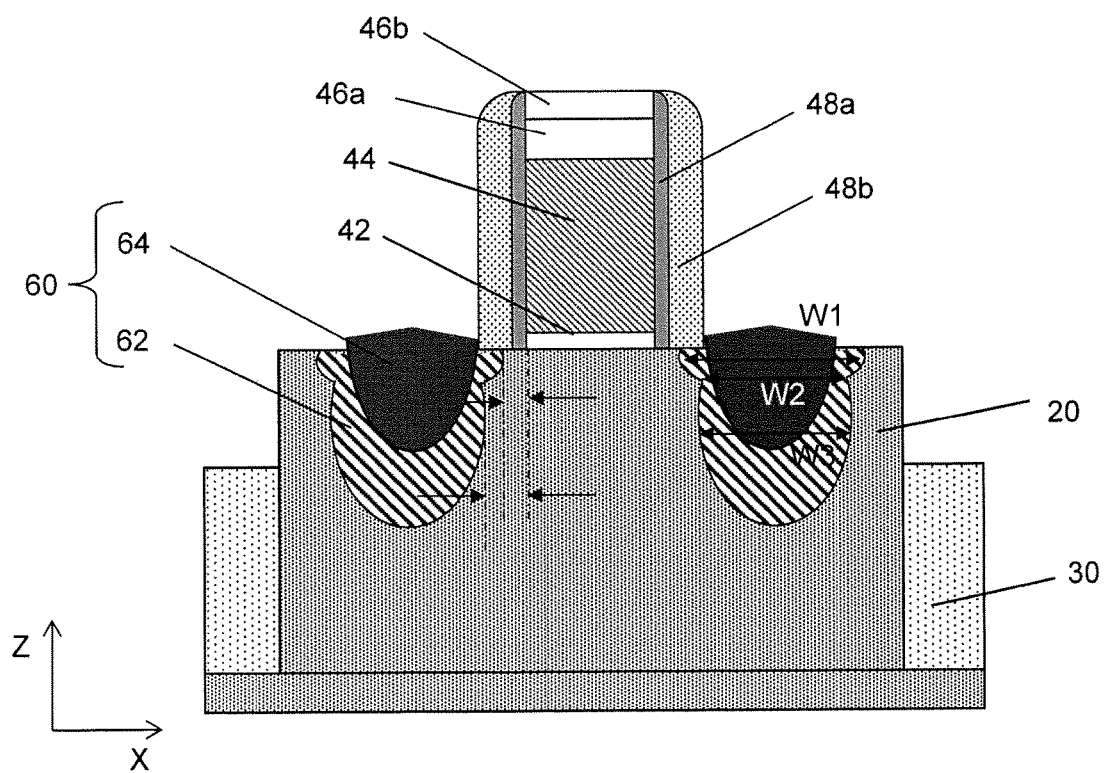
FIG. 9 shows a cross sectional view of one of the various stages for manufacturing a semiconductor device according to an embodiment of the present disclosure.

Then, as shown in FIG. 9, a source/drain epitaxial layer 60 is formed in the third recess. The source/drain epitaxial layer 60 is formed by CVD, ALD, molecular beam epitaxy (MBE) or any other suitable epitaxial growth methods. After the source/drain epitaxial layer 60 is formed the dimensions of the third recess 56 is substantially maintained.

In some embodiments, the source/drain epitaxial layer 60 includes one or more layers of SiP, SiCP, SiC, SiGe, SiGeSn, SiGeB or other suitable semiconductor material. In some embodiments, as shown in FIG. 9, the source/drain epitaxial layer 60 includes a first epitaxial layer 62 and a second epitaxial layer.

In some embodiments, the first epitaxial layer 62 is SiP for an n-type FET. The amount of P is in a range from about $1\times10^{20}$ atoms·cm$^{-3}$ to about $1\times10^{21}$ atoms·cm$^{-3}$ in some embodiments, and is in a range from about $2\times10^{20}$ atoms·cm$^{-3}$ to about $6\times10^{20}$ atoms·cm$^{-3}$ in other embodiments.

In some embodiments, the second epitaxial layer 64 is SiP, where the amount of P is greater than the amount of P in the first epitaxial layer 62. The amount of P in the second epitaxial layer 64 is in a range from about $1\times10^{21}$ atoms·cm$^{-3}$ to about $5\times10^{21}$ atoms·cm$^{-3}$ in some embodiments, and is in a range from about $2\times10^{21}$ atoms·cm$^{-3}$ to about $4\times10^{21}$ atoms·cm$^{-3}$ in other embodiments.

In some embodiments, the SiP epitaxial layers are grown at a temperature of about 700° C. to 850° C. under a pressure of about 5 Torr to 50 Torr, by using a Si containing gas such as $SiH_4$, $Si_2H_6$ or $SiCl_2H_2$; HCl; and/or a dopant gas, such as $PH_3$.

In some embodiments, the first epitaxial layer 62 is in contact with a bottom of the sidewall spacers 48a and/or 48b and not in contact with side faces of the second sidewall spacers 48b. In some embodiments, the second epitaxial layer 64 does not penetrate the portion under the sidewall spacers 48a and 48b. In some embodiments, the second epitaxial layer 64 is not in contact with the bottom of the sidewall spacers 48a and/or 48b and is in contact with the side faces of the second sidewall spacers 48b.

In certain embodiments, a top of the second epitaxial layer 64 is located above a level of a top of the channel region of the fin structure 20.

In other embodiments, the first epitaxial layer 62 and the second epitaxial layer 64 are made of SiGe for a p-type FET, and a germanium amount of the second epitaxial layer 64 is greater than a germanium amount of the first epitaxial layer 62. In some embodiments, the Ge amount of the first epitaxial layer is in a range from about 20 atomic % to 40 atomic % and the Ge amount of the second epitaxial layer is in a range from about 35 atomic % to about 50 atomic %.

In certain embodiments, the SiGe epitaxial layers contain boron as dopant. In some embodiments, a boron concentration of the second epitaxial layer 64 is greater than a boron concentration of the first epitaxial layer 62. The amount of B in the second epitaxial layer 64 is in a range from about $1\times10^{20}$ atoms·cm$^{-3}$ to about $5\times10^{20}$ atoms·cm$^{-3}$, and the amount of B in the second epitaxial layer is in a range from about $5\times10^{20}$ atoms·cm$^{-3}$ to about $1\times10^{21}$ atoms·cm$^{-3}$ in other embodiments.

After forming the source/drain epitaxial layer, further CMOS processes are performed to form various features such as interlayer dielectric layers, contacts/vias, interconnect metal layers, and passivation layers, etc.

Figure 10:
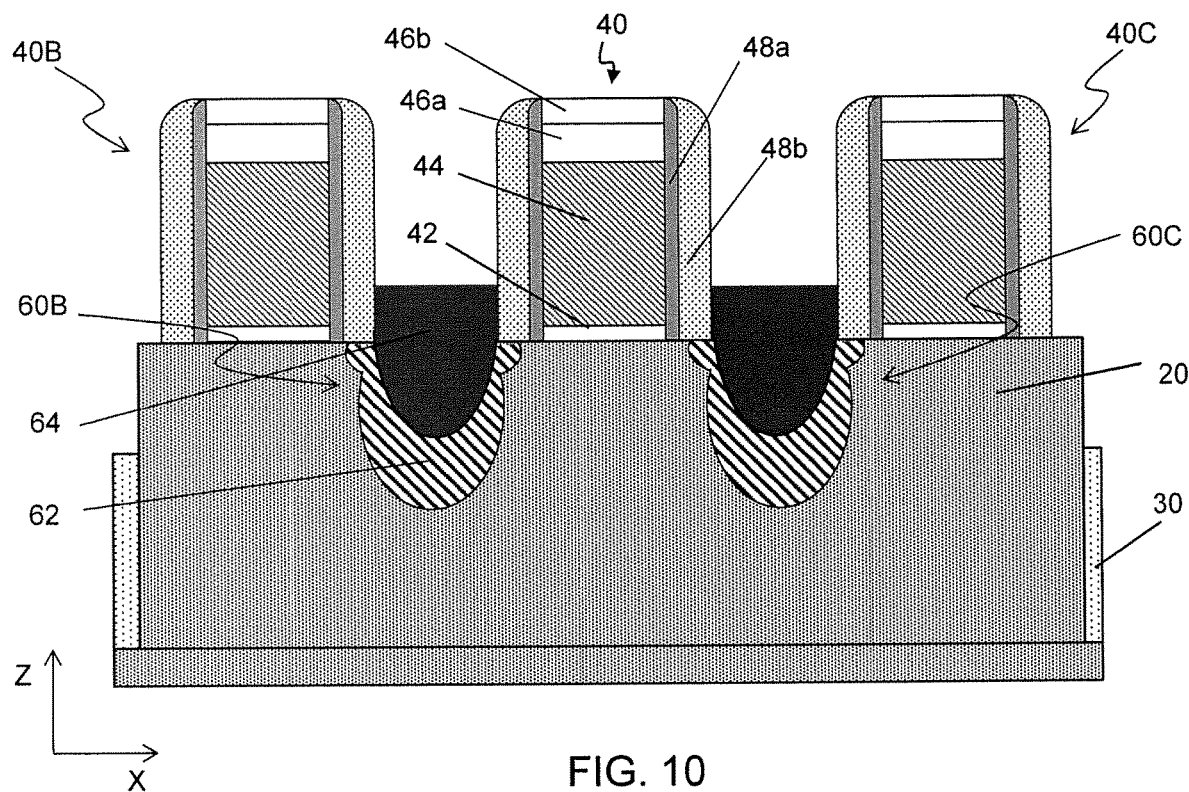
FIG. 10 shows a cross sectional view of one of the various stages for manufacturing a semiconductor device according to an embodiment of the present disclosure.

FIG. 10 shows a cross sectional view of one of the various stages for manufacturing a semiconductor device according to an embodiment of the present disclosure. Material, configuration, process, structures and/or dimensions explained with respect to FIGS. 1-9 may be employed in the following embodiment, and the details thereof may be omitted for simplicity.

As shown in FIG. 10, additional gate structures 40B and 40C are disposed over the fin structure 20 so as to sandwich the gate structure 40. A first source/drain epitaxial layer 60B is formed between the gate structure 40 and gate structure 40B, and a second source/drain epitaxial layer 60C is formed between the gate structure 40 and gate structure 40C. The second epitaxial layers 64 of the first and second source/drain epitaxial layers 60B and 60C are in contact with the side faces of the second sidewall spacers 48b of the gate structures 40, 40B and 40C, and protrude over the upper surface of the channel region of the fin structure.

Figure 11:
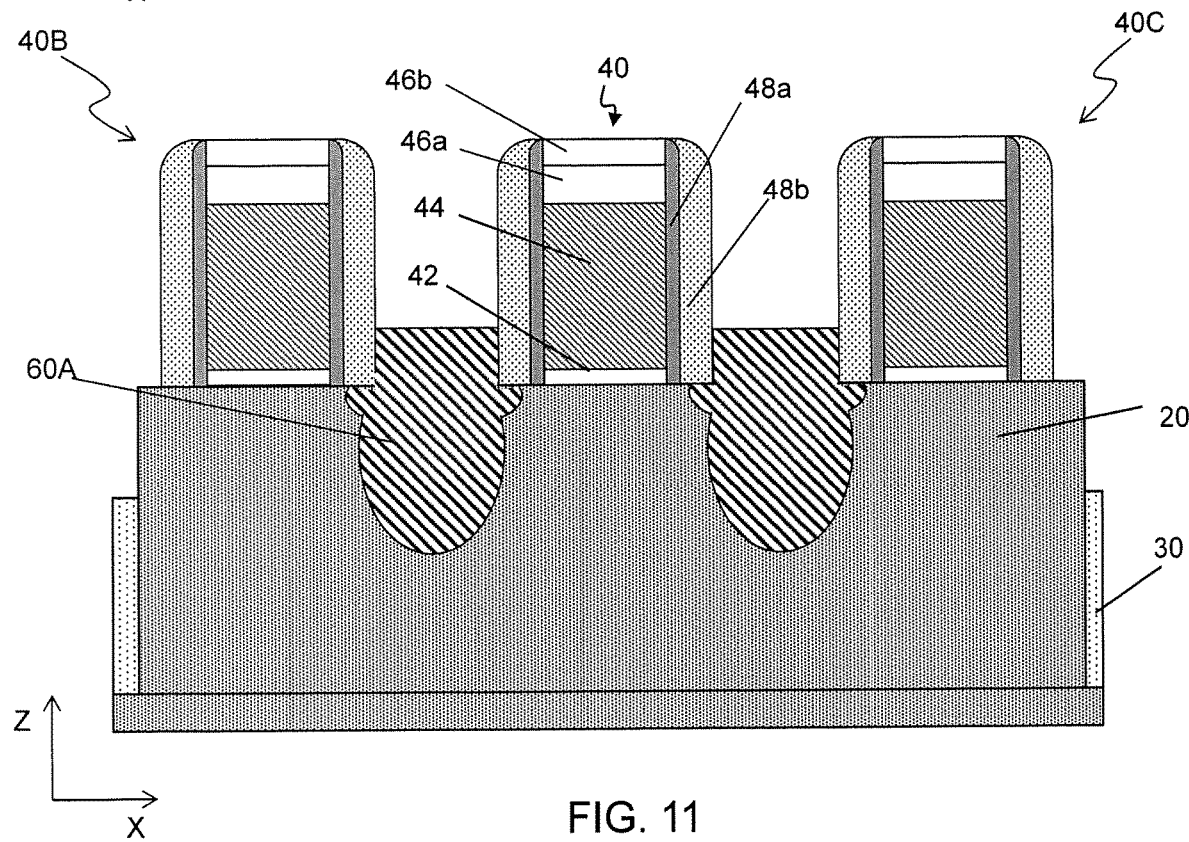
FIG. 11 shows a cross sectional view of one of the various stages for manufacturing a semiconductor device according to an embodiment of the present disclosure.

FIG. 11 shows a cross sectional view of one of the various stages for manufacturing a semiconductor device according to an embodiment of the present disclosure. Material, configuration, process, structures and/or dimensions explained with respect to FIGS. 1-10 may be employed in the following embodiment, and the details thereof may be omitted for simplicity.

As shown in FIG. 11, similar to FIG. 10, additional gate structures 40B and 40C are disposed over the fin structure 20 so as to sandwich the gate structure 40. In this embodiment, the source/drain epitaxial layer includes a single epitaxial layer 60A. The material of the source/drain epitaxial layer 60A includes SiP, SiCP or SiC for an n-type FET and SiGe, SiGeSn or SiGeB for a p-type FET. In some embodiments, the source/drain epitaxial layers 60A in contact with the side faces and the bottom faces of the second sidewall spacers 48b of the gate structures 40, 40B and 40C, and protrude over the upper surface of the channel region of the fin structure.

Figure 12:
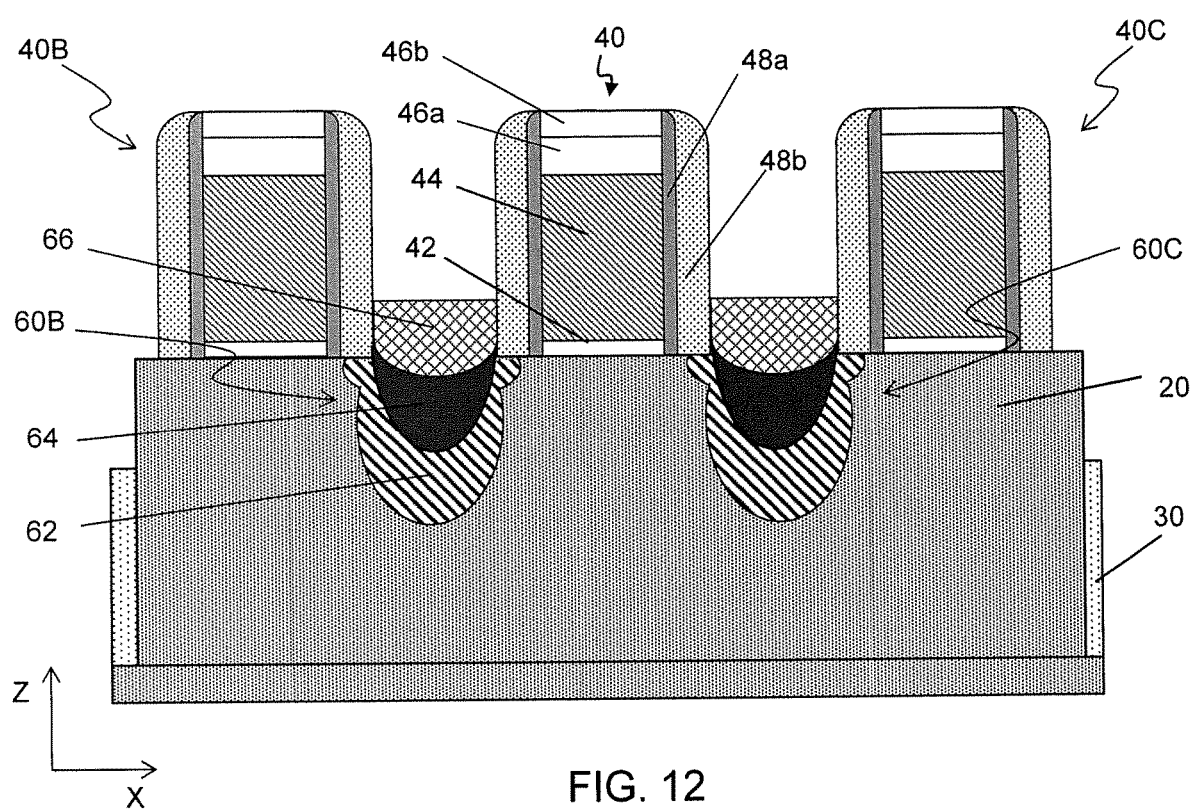
FIG. 12 shows a cross sectional view of one of the various stages for manufacturing a semiconductor device according to an embodiment of the present disclosure.

FIG. 12 shows a cross sectional view of one of the various stages for manufacturing a semiconductor device according to an embodiment of the present disclosure. Material, configuration, process, structures and/or dimensions explained with respect to FIGS. 1-11 may be employed in the following embodiment, and the details thereof may be omitted for simplicity.

As shown in FIG. 12, similar to FIGS. 10 and 11, additional gate structures 40B and 40C are disposed over the fin structure 20 so as to sandwich the gate structure 40. A first source/drain epitaxial layer 60B is formed between the gate structure 40 and gate structure 40B, and a second source/drain epitaxial layer 60C is formed between the gate structure 40 and gate structure 40C. Each of the first and second source/drain epitaxial layers includes a first epitaxial layer 62, a second epitaxial layer 64 and a third epitaxial layer 66 formed in this order.

In some embodiments, the third epitaxial layers 66 of the first and second source/drain epitaxial layers 60B and 60C are in contact with the side faces of the second sidewall spacers 48b of the gate structures 40, 40B and 40C, and protrude over the upper surface of the channel region of the fin structure. In certain embodiments, the second epitaxial layers 64 are also in contact with the side faces of the second sidewall spacers 48b. In some embodiments, the bottom of the third epitaxial layer 66 is located above or below the top of the channel region. In certain embodiments, the top of the second epitaxial layer 64 is located above or below the top of the channel region.

FIGS. 13-18 show various stages for manufacturing a semiconductor device according to an embodiment of the present disclosure. It is understood that additional operations can be provided before, during, and after processes shown by FIGS. 13-18, and some of the operations described below can be replaced or eliminated, for additional embodiments of the method. The order of the operations/processes may be interchangeable. Material, configuration, process, structures and/or dimensions explained with respect to FIGS. 1-12 may be employed in the following embodiment, and the details thereof may be omitted for simplicity.

Figure 13:
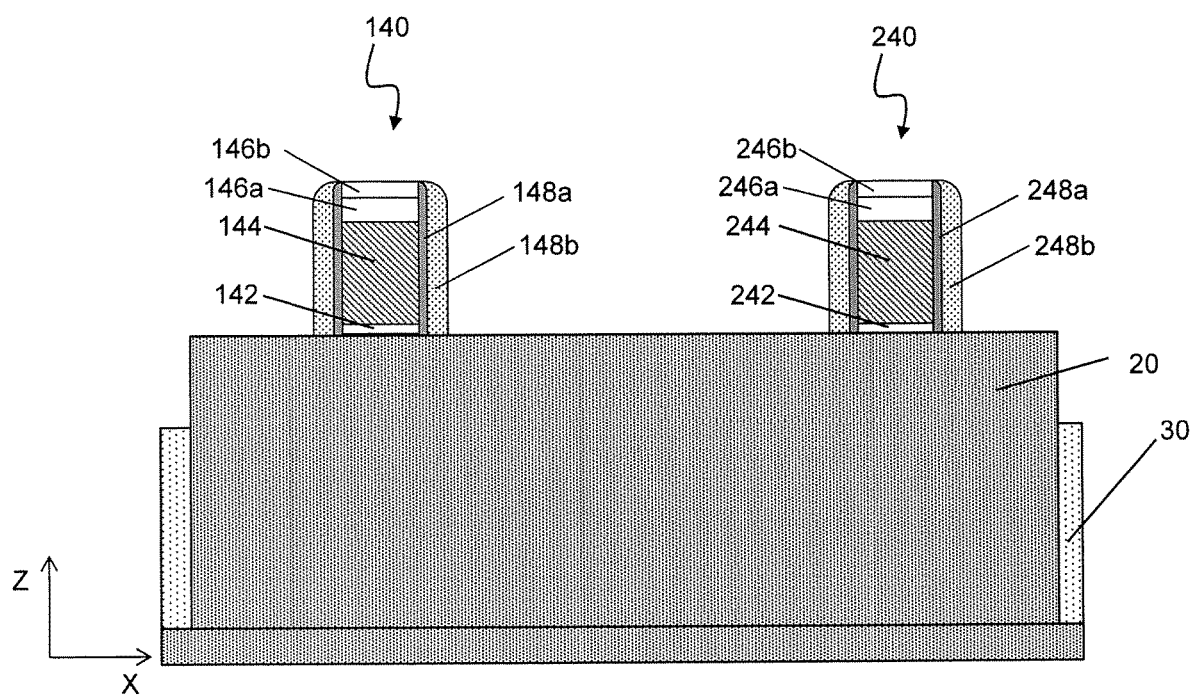
FIG. 13 shows a cross sectional view of one of the various stages for manufacturing a semiconductor device according to an embodiment of the present disclosure.

As shown in FIG. 13, a first gate structure 140 for a first conductivity type FET and a second gate structure 240 for a second conductivity type FET are formed over a fin structure 20. In some embodiments, the first gate structure 140 and the second gate structure 240 are formed over different fin structures. In some embodiments, the first conductivity type is n-type and the second conductivity type is p-type. In other embodiments, the first conductivity type is p-type and the second conductivity type is n-type.

The first gate structure 140 includes a gate dielectric layer 142, a gate electrode layer 144, a first mask pattern 146a, a second mask pattern 146b, first sidewall spacers 148a and second sidewall spacers 148b. The second gate structure 240 includes a gate dielectric layer 242, a gate electrode layer 244, a first mask pattern 246a, a second mask pattern 246b, first sidewall spacers 248a and second sidewall spacers 248b. The materials and configurations of the first and second gate structure are the same as those of the gate structure 40 in some embodiments. In some embodiments, the gate dielectric layers 142 and 242 and the gate electrode layers 144 and 244 are a dummy gate dielectric layer and a dummy gate electrode layer, respectively.

Figure 14:
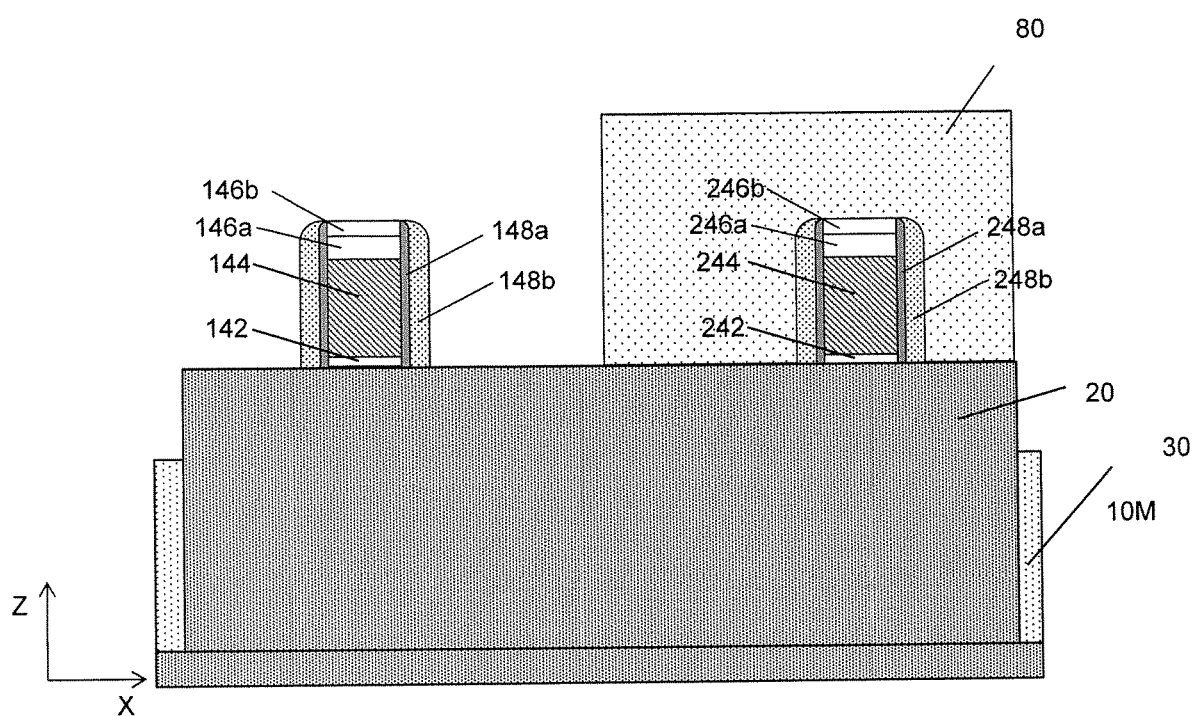
FIG. 14 shows a cross sectional view of one of the various stages for manufacturing a semiconductor device according to an embodiment of the present disclosure.

Then, as shown in FIG. 14, the second gate structure 240 is covered by a protection layer 80. In some embodiments, the protection layer includes dielectric material, such as silicon nitride. In certain embodiments, silicon nitride is conformally formed over the second gate structure 240 by CVD, ALD or any other suitable film formation method.

Figure 15:
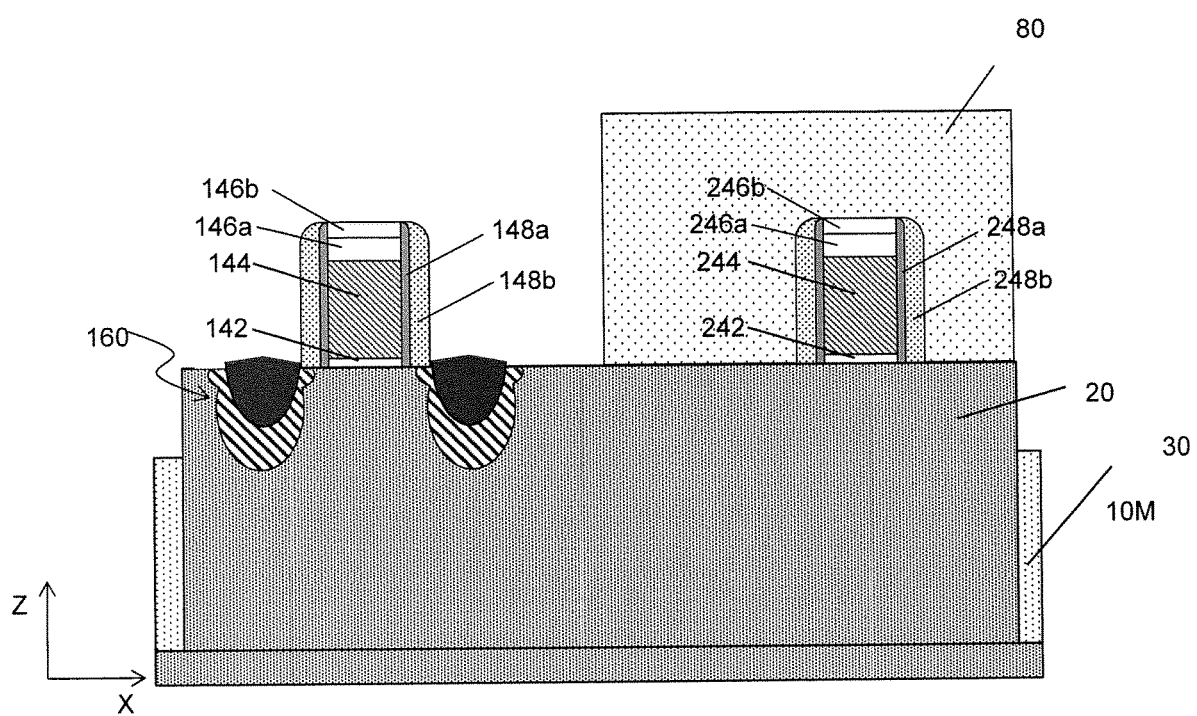
FIG. 15 shows a cross sectional view of one of the various stages for manufacturing a semiconductor device according to an embodiment of the present disclosure.

Next, as shown in FIG. 15, by the same or similar operations as described with respect to FIGS. 6-9, a first source/drain epitaxial layer 160 is formed on both sides of the first gate structure 140.

Figure 16:
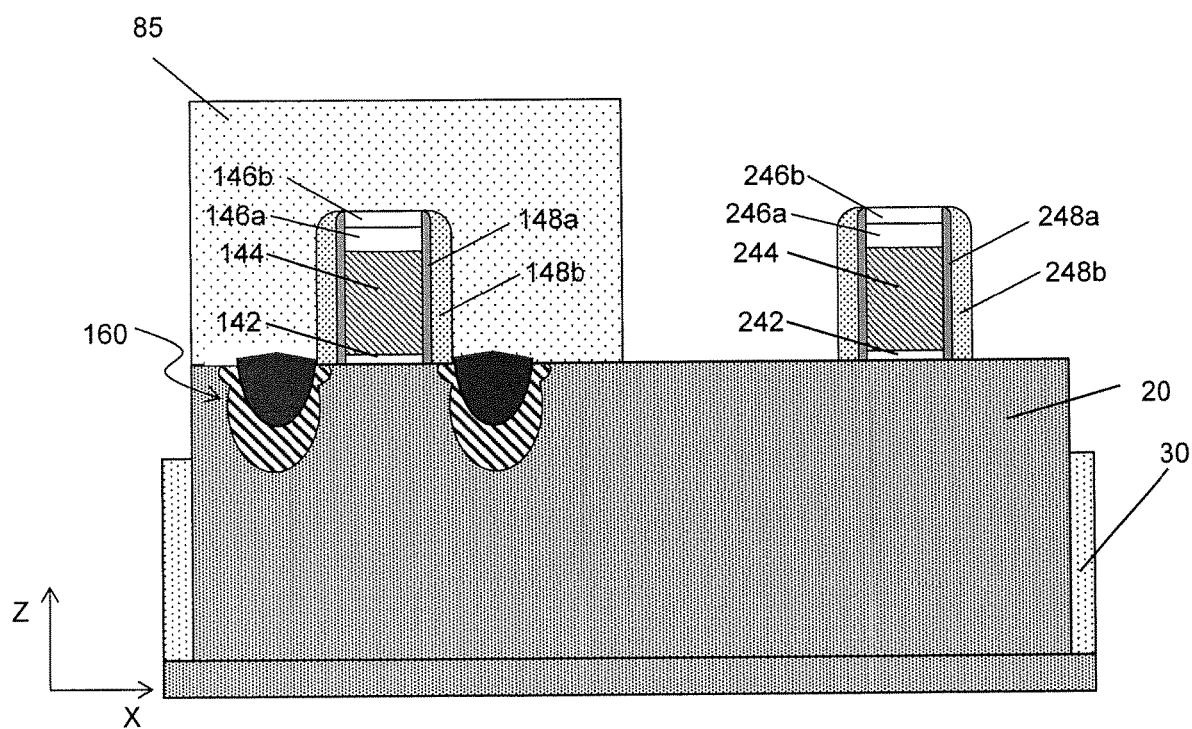
FIG. 16 shows a cross sectional view of one of the various stages for manufacturing a semiconductor device according to an embodiment of the present disclosure.

Then, the protection layer 80 is removed, and another protection layer 85 is formed to cover the first gate structure 140 and the first source/drain epitaxial layer 140, as shown in FIG. 16.

Figure 17:
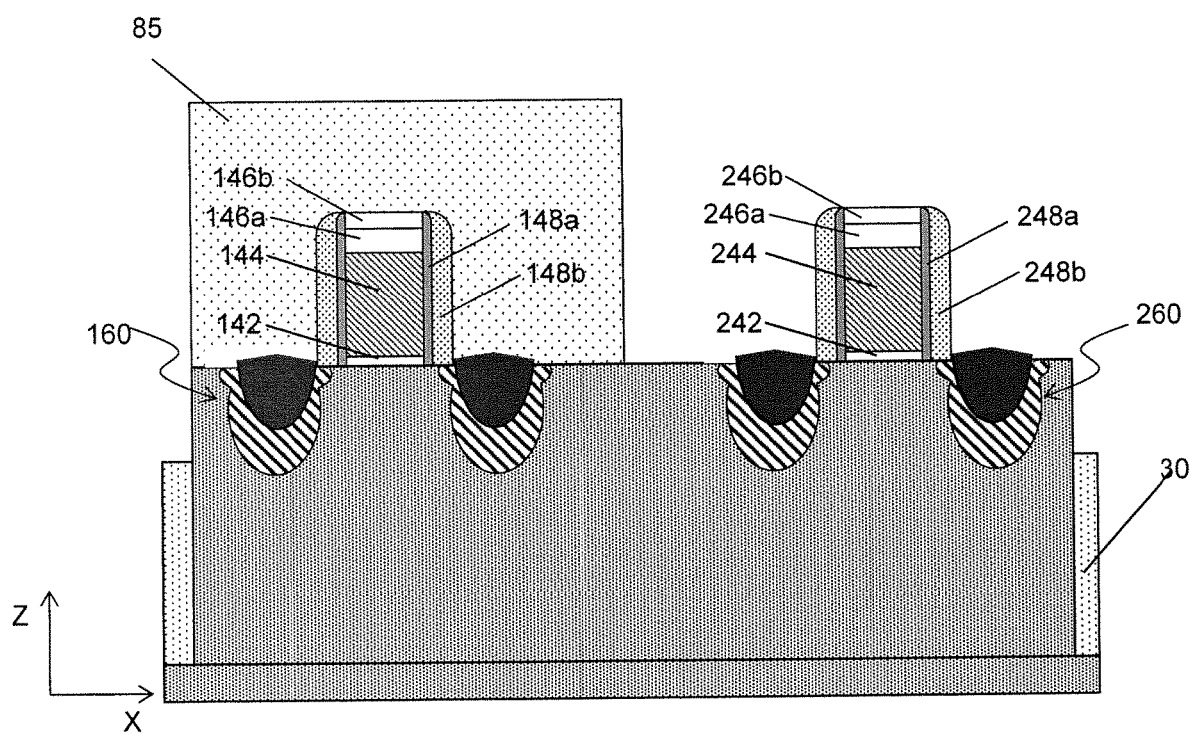
FIG. 17 shows a cross sectional view of one of the various stages for manufacturing a semiconductor device according to an embodiment of the present disclosure.

Next, as shown in FIG. 17, by the same or similar operations as described with respect to FIGS. 6-9, a second source/drain epitaxial layer 260 is formed on both sides of the second gate structure 240. Then, the protection layer 85 is removed.

Figure 18:
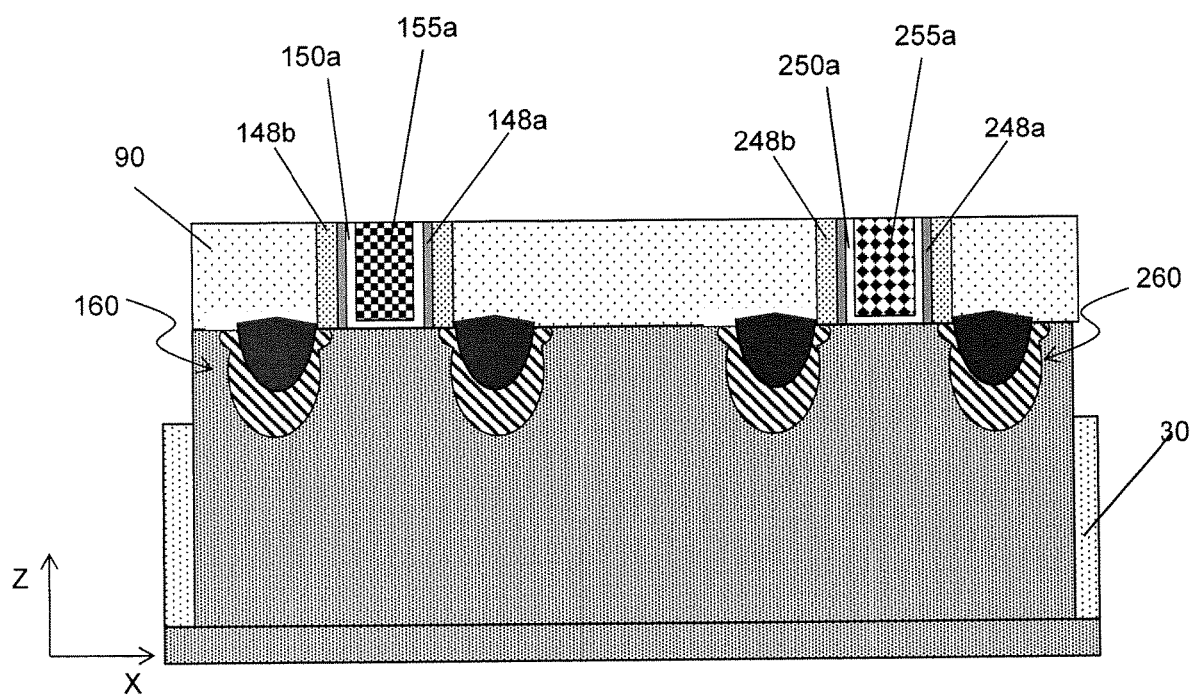
FIG. 18 shows a cross sectional view of one of the various stages for manufacturing a semiconductor device according to an embodiment of the present disclosure.

Subsequently, one or more interlayer dielectric layers 90 are formed. By using a gate replacement technique, a first metal gate structure including a first gate dielectric layer 150a and a first metal gate 155a and a second metal gate structure including a second gate dielectric layer 250a and a second metal gate 255a are formed, as shown in FIG. 18.

In some embodiments, the dummy gate structures (dummy gate electrode layers 144 and 244 and dummy gate dielectric layer 142 and 242) are removed and replaced with a metal gate structures (metal gate electrode and gate dielectric layer). In certain embodiments, the interlayer dielectric layer is formed over the dummy gate structures and a planarization operation, such as a chemical mechanical polishing (CMP) process or an etch-back process, is performed to expose the upper surface of the dummy gate electrode layers. Then, the dummy gate electrode layers and the dummy gate dielectric layers are removed, by appropriate etching processes, respectively, to form a gate opening. Metal gate structures including a gate dielectric layer and metal gate electrode are formed in the gate openings. In some embodiments, the gate replacement process is performed separately for an n-type FET and a p-type FET.

The gate dielectric layer may be formed over an interface layer (not shown) disposed over the channel layer of the fin structures 20. The interface layer may include silicon oxide or germanium oxide with a thickness of 0.2 nm to 1.5 nm in some embodiments. In other embodiments, the thickness of the interface layer is in a range about 0.5 nm to about 1.0 nm.

The gate dielectric layer includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 10 nm in some embodiments, and may be in a range from about 2 nm to about 7 nm in other embodiments.

The metal gate electrode is formed over the gate dielectric layer. The metal gate electrode includes one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) may be interposed between the gate dielectric layer and the metal gate electrode. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer.

After forming the metal gate structures, further CMOS processes are performed to form various features such as interlayer dielectric layers, contacts/vias, interconnect metal layers, and passivation layers, etc.

In the present disclosure, by using isotropic etching before performing anisotropic etching to recess a source/drain region of a fin structure, a proximity between the source/drain epitaxial layer and the channel region can be decreased. In particular, it is possible to set the closest portion between the source/drain epitaxial layer and the channel region as high as possible (as close to the gate electrode as possible), which can improve transistor performance.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure is formed over a substrate. The fin structure has a channel region and a source/drain region. A gate structure is formed over the channel region of the fin structure. A first source/drain etching is performed to recess the source/drain region of the fin structure. After the first source/drain etching, a second source/drain etching is performed to further recess the source/drain region of the fin structure. After the second source/drain etching, a third source/drain etching is performed to further recess the source/drain region of the fin structure, thereby forming a source/drain recess. One or more epitaxial layers are formed in the source/drain recess. The first source/drain etching is isotropic etching and the second source/drain etching is anisotropic etching. In one or more of the foregoing and following embodiments, the third source/drain etching is isotropic etching. In one or more of the foregoing and following embodiments, the gate structure includes a gate dielectric layer disposed on the channel, a gate layer disposed on the gate dielectric layer and sidewall spacers disposed on opposing side faces of the gate layer, and by the first source/drain etching, the source/drain region of the fin structure is laterally etched to a portion under the sidewall spacers. In one or more of the foregoing and following embodiments, by the first source/drain etching, the source/drain region of the fin structure is laterally etched to not reach a portion under the gate layer. In one or more of the foregoing and following embodiments, in the second source/drain etching, an amount of vertical etching is 10 times or more an amount of lateral etching. In one or more of the foregoing and following embodiments, by the third source/drain etching, the source/drain region of the fin structure is laterally etched to not reach a portion under the gate layer. In one or more of the foregoing and following embodiments, after the third source/drain etching the source/drain recess has a first width, a second width smaller than the first width and a third width greater than the second width, and the second width is located between the first width and the third width in a vertical direction of the source/drain recess. In one or more of the foregoing and following embodiments, the first width is a largest width of the source/drain recess. In one or more of the foregoing and following embodiments, the first width is located at a level below a top of the channel region by an amount D, where $0<D<0.2\times L$, L is a depth of the source/drain recess. In one or more of the foregoing and following embodiments, the source/drain recess has a largest width at a level below a top of the channel region by an amount D, where $0<D<0.2\times L$, L is a depth of the source/drain recess. In one or more of the foregoing and following embodiments, the one or more epitaxial layers include a first epitaxial layer and a second epitaxial layer formed on the first epitaxial layer, and the second epitaxial layer does not penetrate the portion under the sidewall spacers. In one or more of the foregoing and following embodiments, a top of the second epitaxial layer is located above a level of a top of the channel region of the fin structure. In one or more of the foregoing and following embodiments, the first epitaxial layer and the second epitaxial layer are made of SiP, and a phosphorous amount of the second epitaxial layer is greater than a phosphorous amount of the first epitaxial layer. In one or more of the foregoing and following embodiments, the first epitaxial layer and the second epitaxial layer are made of SiGe, and a germanium amount of the second epitaxial layer is greater than a germanium amount of the first epitaxial layer. In one or more of the foregoing and following embodiments, the sidewall spacers includes first sidewall spacer layers and second sidewall spacer layer disposed over the first sidewall spacer layers, and by the first source/drain etching, the source/drain region of the fin structure is laterally etched to a portion under the second sidewall spacers. In one or more of the foregoing and following embodiments, by the first source/drain etching, the source/drain region of the fin structure is laterally etched to not reach a portion under the first sidewall spacer layers. In one or more of the foregoing and following embodiments, by the third source/drain etching, the source/drain region of the fin structure is laterally etched to not reach a portion under the first sidewall spacer layers.

In accordance with another aspect of the present disclosure, in a method of manufacturing a semiconductor device, a fin structure is formed over a substrate. The fin structure has a channel region. Gate structures are formed over the channel region of the fin structure. A first source/drain etching is performed to recess a source/drain region of the fin structure disposed between the gate structures. After the first source/drain etching, a second source/drain etching is performed to further recess the source/drain region of the fin structure. After the second source/drain etching, a third source/drain etching is performed to further recess the source/drain region of the fin structure, thereby forming a source/drain recess. A first epitaxial layer and a second epitaxial layer are formed over the first epitaxial layer in the source/drain recess. The first source/drain etching is isotropic etching and the second source/drain etching is anisotropic etching. The gate structure includes a gate dielectric layer disposed on the channel, a gate layer disposed on the gate dielectric layer and sidewall spacers disposed on opposing side faces of the gate layer. The first epitaxial layer is in contact with a bottom of the sidewall spacers and not in contact with side faces of the sidewall spacers. In one or more of the foregoing and following embodiments, the second epitaxial layer is not in contact with the bottom of the sidewall spacers and is in contact with the side faces of the sidewall spacers.

In accordance with another aspect of the present disclosure, in a method of manufacturing a semiconductor device, a fin structure is formed over a substrate. The fin structure has a first channel region and a second channel region. A first gate structure is formed over the first channel region and a second gate structure is formed over the second channel region. A first source/drain etching is performed to recess a first source/drain region adjacent to the first channel region. One or more first epitaxial layers are formed in the first source/drain recess. A second source/drain etching is performed to recess a second source/drain region adjacent to the second channel region. One or more second epitaxial layers are formed in the first source/drain recess. At least one of the first and second source/drain etching includes a first isotropic etching, a second anisotropic etching and a third isotropic etching performed in this order.

In accordance with one aspect of the present disclosure, a semiconductor device includes a gate structure including a gate dielectric layer disposed over a channel region of a fin structure and a gate electrode disposed over the gate dielectric layer, sidewall spacers disposed on opposing side faces of the gate structure, and a source/drain epitaxial layer formed in a source/drain region of the fin structure. The source/drain epitaxial layer has a first width, a second width smaller than the first width and a third width greater than the second width. The first width is located below a top of the channel region of the fin structure, and the second width is located between the first width and the third width in a vertical direction of the source/drain epitaxial layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a fin structure made of a semiconductor material and having a first region and a second region disposed on opposite sides of the first region;
    forming a gate structure over the first region of the fin structure;
    performing a first etching on the second region to form a first recess at the second region of the fin structure;
    after the first etching, performing a second etching on the second region to form a second recess at the second region of the fin structure, wherein the first etching is isotropic etching and the second etching is anisotropic etching; and
    forming a first epitaxial layer and a second epitaxial layer disposed on the first epitaxial layer, each of the first and second epitaxial layers below a top of the fin structure being fully in contact with the semiconductor material of the fin structure,
    wherein the first and second epitaxial layers comprise silicon and one of phosphorous or germanium, and concentration of phosphorous or germanium in the second epitaxial layer is greater than concentration of phosphorous or germanium in the first epitaxial layer.

2. The method of claim 1, further comprising: after the second etching, performing a third etching on the second region to form a third recess at the second region of the fin structure, thereby forming a source/drain recess.

3. The method of claim 2, wherein the third etching is isotropic etching.

4. The method of claim 2, wherein:
    the gate structure includes a gate dielectric layer, a gate electrode layer disposed on the gate dielectric layer and sidewall spacers disposed on opposing side faces of the gate electrode layer, and by the first etching, the second region of the fin structure is laterally etched to a portion under the sidewall spacers, and not to reach a portion under the gate layer.

5. The method of claim 4, wherein a depth of the first recess is in range from 1 nm to 10 nm.

6. The method of claim 5, wherein the depth of the first recess is equal to or greater than a penetration amount of the first recess under one of the sidewall spacers.

7. The method of claim 2, wherein a location of a largest width of the third recess is at a depth D from a level of a top of the first region of the fin structure, and $0<D4<0.2\times D3$ where D3 is a depth of the third recess.

8. The method of claim 2, further comprising forming a third epitaxial layer over the second epitaxial layer,
wherein the third epitaxial layer is not in contact with the first epitaxial layer.

9. A semiconductor device comprising:
a gate structure including a gate dielectric layer disposed over a channel region of a fin structure, a gate electrode disposed over the gate dielectric layer, and sidewall spacers disposed on opposing side faces of the gate dielectric layer and the gate electrode; and
a source/drain epitaxial layer comprising one or more of SiP, SiCP, SiC, SiGe, SiGeSn, and SiGeB formed in a source/drain region of the fin structure, wherein:
the source/drain epitaxial layer is disposed in a recess formed in the source/drain region of the fin structure, the recess having a first portion and a second portion which is disposed below the first portion, and
a width of the recess discontinuously changes between the first portion and the second portion.

10. The semiconductor device of claim 9, wherein the source/drain epitaxy layer includes a first epitaxial layer and a second epitaxial layer having a different composition than the first epitaxial layer.

11. The semiconductor device of claim 10, wherein the first and second epitaxial layers comprise SiP, and concentration of phosphorous in the second epitaxial layer is greater than concentration of phosphorous in the first epitaxial layer.

12. The semiconductor device of claim 10, wherein the first and second epitaxial layers comprise SiGe or SiGeB, and concentration of germanium in the second epitaxial layer is greater than concentration of germanium in the first epitaxial layer.

13. The semiconductor device of claim 10, wherein:
the source/drain epitaxial layer includes extension portions disposed below the sidewall spacers, respectively, and the extension portions comprises the first epitaxial layer and does not comprise the second epitaxial layer.

14. The semiconductor device of claim 10, wherein:
the source/drain epitaxial layer further comprises a third epitaxial layer disposed over the second epitaxial layer, and
the third epitaxial layer is not in contact with the first epitaxial layer.

15. The semiconductor device of claim 14, wherein a bottom of the third epitaxial layer is located above a top of the channel region.

16. A semiconductor device comprising:
a first gate structure and a second gate structure, each of which includes a gate dielectric layer disposed over a channel region of a fin structure, a gate electrode disposed over the gate dielectric layer, and sidewall spacers disposed on opposing side faces of the gate dielectric layer and the gate electrode; and
a source/drain epitaxial layer disposed between the first and second gate structures,
wherein a width of the source/drain epitaxial layer in a direction along which the fin structure extends increases, from a bottom of the source/drain epitaxial layer, takes a first maximum, decreases, takes a first minimum, increases, takes a second maximum and decreases, sequentially.

17. The semiconductor device of claim 16, wherein the second maximum is greater than the first maximum and is greater than a space between one of the sidewall spacers of the first gate structure and one of the sidewall spacers of the second gate structure facing the one of the sidewall spacers of the first gate structure.

18. The semiconductor device of claim 17, wherein a location of the first maximum is at a depth D1 from a top of the channel region, and $0.3\times D0<D1<0.7\times D0$, where D0 is a depth of the source/drain epitaxial layer from the top of the channel region.

19. The semiconductor device of claim 17, wherein a location of the second maximum is at a depth D2 from a top of the channel region, and $0.3\times D0<D2<0.7\times D0$, where D0 is a depth of the source/drain epitaxial layer from the top of the channel region.

20. The semiconductor device of claim 17, wherein a location of the first minimum is at a depth D3 from a top of the channel region, and $0.1\times D0<D3<0.3\times D0$, where D0 is a depth of the source/drain epitaxial layer from the top of the channel region.

* * * * *